(12) United States Patent
Chung et al.

(10) Patent No.: US 7,683,371 B2
(45) Date of Patent: Mar. 23, 2010

(54) DISPLAY PANEL AND METHOD FOR MANUFACTURING THE SAME

(75) Inventors: Chae-Woo Chung, Cheonan-si (KR); Jeong-Ho Lee, Seoul (KR); Yong Woo Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 238 days.

(21) Appl. No.: 11/850,312

(22) Filed: Sep. 5, 2007

(65) Prior Publication Data
US 2008/0079000 A1 Apr. 3, 2008

(30) Foreign Application Priority Data
Sep. 5, 2006 (KR) .................. 10-2006-0085310

(51) Int. Cl.
*H01L 27/13* (2006.01)
(52) U.S. Cl. .................. 257/59; 257/347; 257/E27.111; 257/E27.113; 438/151

(58) Field of Classification Search ............... 257/59, 257/347, E27.111, E27.113; 438/151
See application file for complete search history.

(56) References Cited

U.S. PATENT DOCUMENTS

| 6,853,405 B2 * | 2/2005 | Lee .................. 349/39 |
| 2004/0232421 A1 * | 11/2004 | Ono et al. .................. 257/59 |
| 2009/0072236 A1 * | 3/2009 | Lai .................. 257/59 |

* cited by examiner

*Primary Examiner*—Trung Dang
(74) *Attorney, Agent, or Firm*—H.C. Park & Associates, PLC

(57) ABSTRACT

A display panel has a protection film having a recess. The recess is arranged above a storage electrode and corresponds to a location of the storage electrode in a plan view. A width of the recess is larger in plan view than a width of the storage electrode, and a pixel electrode is arranged on the protection film. The capacitance of a storage capacitor formed by charges stored in the pixel electrode and the storage electrode is determined by a thickness of the protection film and an overlapping area of the pixel electrode and the storage electrode.

22 Claims, 9 Drawing Sheets

DISPLAY PANEL AND METHOD FOR MANUFACTURING THE SAME

CROSS-REFERENCE TO RELATED APPLICATIONS

This application claims priority from and the benefit of Korean Patent application No. 10-2006-0085310, filed on Sep. 5, 2006, which is hereby incorporated by reference for all purposes as if fully set forth herein.

BACKGROUND OF THE INVENTION

1. Field of the Invention

The present invention relates to a display panel and a method for manufacturing the same, and more particularly, to a display panel having a pixel with an enhanced aperture ratio, and a method for manufacturing the display panel.

2. Discussion of the Background

Generally, a liquid crystal display (LCD) includes a thin film transistor substrate having pixel electrodes and switching thin film transistors connected to the pixel electrodes, a common electrode substrate having a common electrode, and a liquid crystal layer arranged between the thin film transistor substrate and the common electrode substrate.

The LCD drives liquid crystals in the liquid crystal layer by applying a voltage between the thin film transistor substrate and the common electrode substrate. The voltage applied between the thin film transistor substrate and the common electrode substrate creates an electric field. Since the liquid crystals in the liquid crystal layer have an anisotropic dielectric constant, the alignment of the liquid crystals is changed when the electric field is applied to the liquid crystals. In addition, since the liquid crystals have an anisotropic refractive index, light transmittance of the LCD apparatus may vary according to the alignment of the liquid crystals. The LCD applies an electric field between the two substrates such that the liquid crystals have a light transmittance corresponding to display information transmitted as data signals. Thus, the alignment of the liquid crystals varies according to the applied electric field, thereby displaying images on the LCD.

In a conventional LCD, a storage electrode is arranged below and overlaps with a pixel electrode. The voltage of the pixel electrode is maintained for a certain period of time using a capacitance between the pixel electrode and the storage electrode.

To increase the capacitance between the pixel electrode and the storage electrode, the size of the storage electrode has been increased. However, increasing the size of the storage electrode may reduce the aperture ratio in a unit pixel since the storage electrode may be a metal material and may block the transmission of light.

SUMMARY OF THE INVENTION

This invention provides a display panel having an increased capacitance between a storage electrode and a pixel electrode by forming a recess to expose a region corresponding to an upper surface of the storage electrode, and having an enhanced aperture ratio by reducing a size of the storage electrode, and a method of manufacturing the display panel.

Additional features of the invention will be set forth in the description which follows, and in part will be apparent from the description, or may be learned by practice of the invention.

The present invention discloses a thin film transistor substrate including a thin film transistor substrate, comprising a thin film transistor arranged on a substrate, wherein the thin film transistor comprises a gate electrode, a first insulation film arranged on the gate electrode, an active layer arranged on the first insulation film, a source electrode and a drain electrode arranged on the active layer, a storage electrode arranged on the substrate, a second insulation film arranged on the thin film transistor, a recess formed in the second insulation film and a pixel electrode arranged on the second insulation film and the recess, wherein the pixel electrode is connected to the thin film transistor. Further, a width of the recess is larger than a width of the storage electrode.

The present invention also discloses a display panel including a thin film transistor substrate. The thin film transistor substrate includes a first substrate comprising, a thin film transistor arranged on the first substrate, wherein the thin film transistor comprises a gate electrode, a first insulation film arranged on the gate electrode, an active layer arranged on the first insulation film, a source electrode and a drain electrode arranged on the active layer; a storage electrode arranged on the substrate, a second insulation film arranged on the thin film transistor, a recess formed in the second insulation film and a pixel electrode arranged on the second insulation film and the recess, wherein the pixel electrode is connected to the thin film transistor. Further, a width of the recess is large than a width of the storage electrode. The display panel also includes a second substrate including a common electrode arranged corresponding to the pixel electrode and a liquid crystal layer arranged between the first substrate and the second substrate.

The present invention also provides a method for manufacturing a thin film transistor substrate. The method includes forming a gate electrode and a storage electrode on a substrate, forming a gate insulation film on the gate electrode and the storage electrode, forming a active layer on the gate insulation, forming a source electrode and a drain electrode on the active layer, forming a protection film on the substrate, forming a recess and forming a pixel electrode on the recess and on the protection film. Further, forming a recess comprises removing a portion of the protection film having a size larger than a size of the storage electrode in a region corresponding to the storage electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 8, FIG. 9, FIG. 10, FIG. 1, and FIG. 12 are cross-sectional views, taken along line A-A in FIG. 1, illustrating a method for manufacturing a display panel according to an exemplary embodiment of the present invention.

DETAILED DESCRIPTION OF THE ILLUSTRATED EMBODIMENTS

Figure 1:
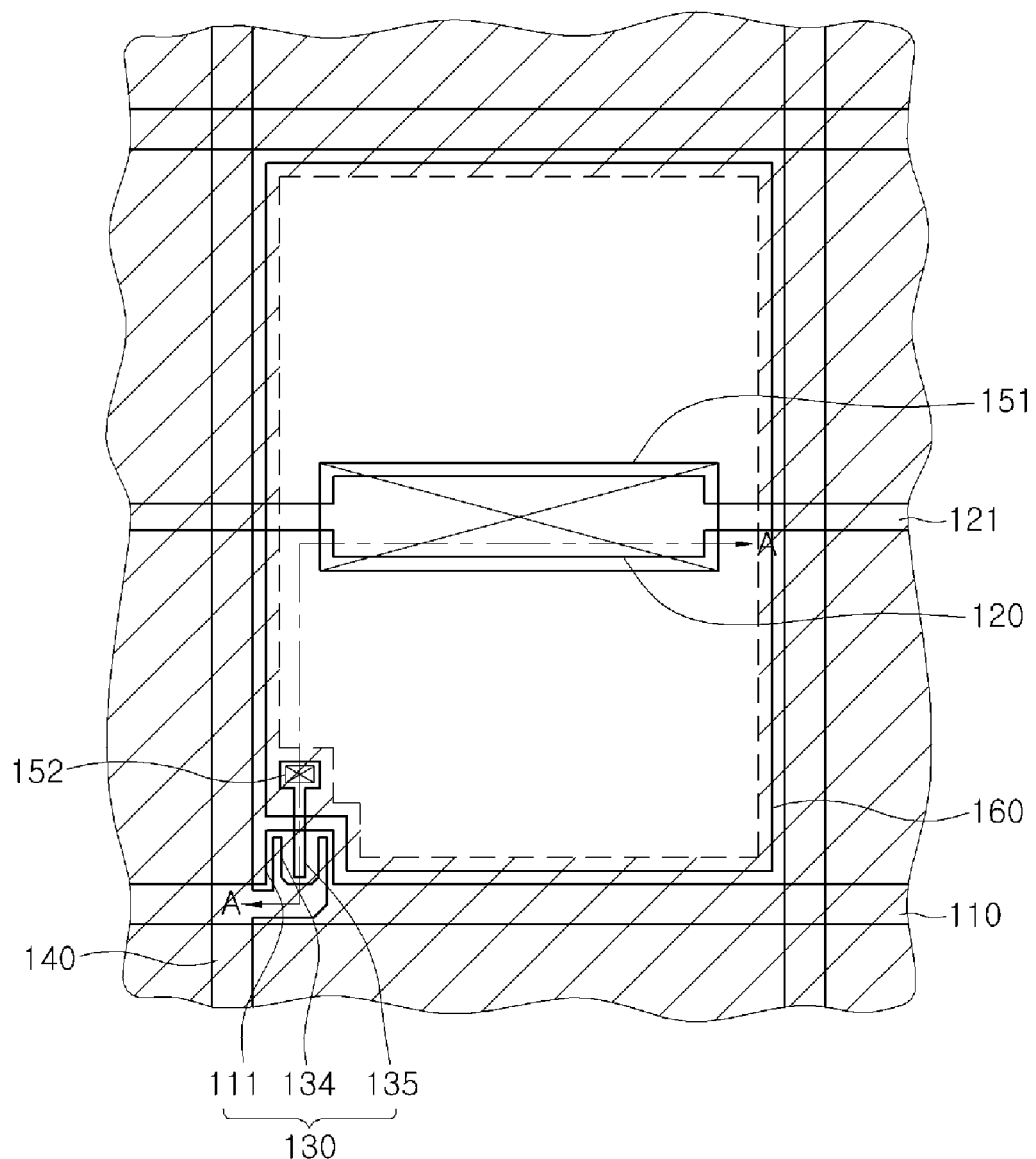
FIG. 1 is a plan view illustrating a display panel according to an exemplary embodiment of the present invention.

Exemplary embodiments of the present invention will be described in detail with reference to the accompanying drawings. However, the present invention is not limited to the embodiments disclosed below but may be implemented into different forms. These embodiments are provided only for illustrative purposes and for full understanding of the scope of the present invention by those skilled in the art.

In the drawings, the thicknesses of layers and regions may be exaggerated for clarity, and like reference numerals are used to designate like elements throughout the specification and drawings. Further, an expression that an element such as a layer, region, substrate or plate is placed "on" or "above" another element indicates not only a case where the element is placed directly on or just above the other element but also a case where a further element is interposed between the element and the other element. Similarly, when an element or layer is referred to as being "connected to" another element or layer, it can be directly connected to the other element or layer, or intervening elements or layers may be present. In contrast, when an element is referred to as being "directly on," "directly above," or "directly connected to" another element or layer, there are no intervening elements or layers present.

Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below," "lower", "under," "above", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

Figure 2:
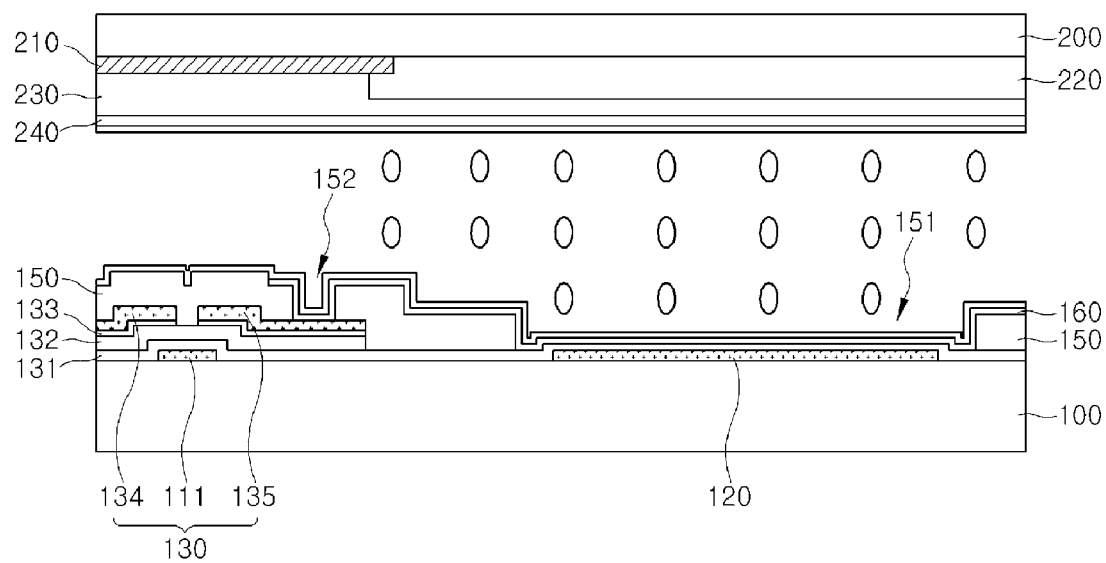
FIG. 2 is a cross-sectional view of the display panel shown in FIG. 1, taken along line A-A.
Figure 3A:
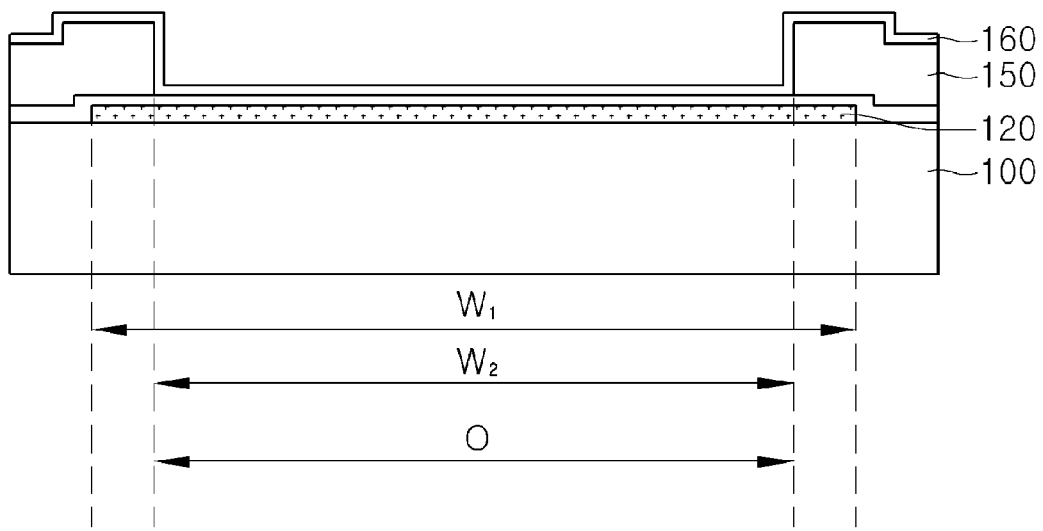
FIG. 3A and FIG. 3B are cross-sectional views illustrating a technical concept according to the exemplary embodiment of the present invention.
Figure 3B:
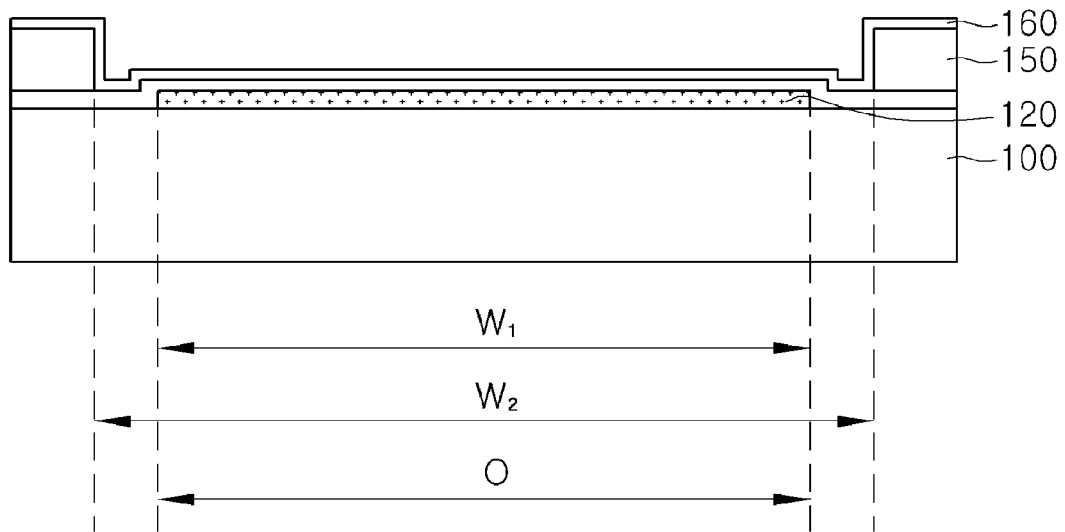

FIG. 1 is a plan view illustrating a display panel according to an exemplary embodiment of the present invention. FIG. 2 is a cross-sectional view of the display panel shown in FIG. 1, taken along line A-A. FIG. 3A and FIG. 3B are cross-sectional views illustrating a technical concept according to the exemplary embodiment of the present invention.

Referring to FIG. 1, FIG. 2, FIG. 3A, and FIG. 3B, the display panel according to this exemplary embodiment includes a lower substrate 100 with a storage electrode 120 and a pixel electrode 160 arranged thereon, an upper substrate 200 having a common electrode 240 arranged thereon and spaced apart from the lower substrate 100, and a liquid crystal layer (not shown) arranged in a region between the lower substrate 100 and the upper substrate 200.

The lower substrate 100 includes gate lines 110 and data lines 140 arranged to cross with each other. A thin film transistor 130 and a storage electrode 120 are arranged at a pixel region, defined where a gate line 110 and a data line 140 cross with each other. Adjacent storage electrodes 120 may be connected together by a storage electrode line 121. A protection film 150 is arranged on the lower substrate 100. In this exemplary embodiment, the protection film 150 is partially removed to form a recess 151 in the pixel region. The recess 151 may be a concave recess, but the invention is not limited thereto. The storage electrode 120 is arranged below a lower surface of the recess 151. The recess 151 may be patterned to be larger than the storage electrode 120 when viewed in the plan view shown in FIG. 1. Further, the pixel electrode 160 is provided on the protection film 150 and on the recess 151.

The storage electrode 120 and the pixel electrode 160 together operate as plates of a storage capacitor. The capacitance of a capacitor is inversely proportional to a distance between two plates of the capacitor and is directly proportional to an overlapping area of the two plates of the capacitor. Thus, the capacitance of the storage capacitor depends on a distance between and an overlapping area of the pixel electrode 160 arranged in the recess 151 and the storage electrode 120 arranged below the concave recess 151.

As shown in FIG. 2, the distance between the storage electrode 120 and the pixel electrode 160 depends on a thickness of a gate insulation film 131 arranged between the storage electrode 120 and the pixel electrode 160. Further, the overlapping area between the storage electrode 120 and the pixel electrode 160 depends on a width of the lower surface of the recess 151. Since a thickness of the gate insulation film 131 is set in accordance with a characteristic of the thin film transistor 130, the capacitance of the storage capacitor may be adjusted depending on the overlapping area between the storage electrode 120 and the pixel electrode 160 in the recess 151. More specifically, a desired capacitance of a storage capacitor may be calculated first. Then a size of an overlapping area of the storage electrode 120 and the lower surface of the recess 151, as well as the size of the storage electrode 120, may then be selected to yield the desired capacitance.

In this exemplary embodiment, to adjust a process margin for forming the recess 151 and the aperture ratio of a pixel as explained in more detail below, the storage electrode 120 may be formed to have a size substantially similar as a desired overlapping area, and the recess 151 may be formed with a lower surface having a size larger than the desired overlapping area.

Where the storage electrode 120 and the lower surface of the recess 151 are formed to have the same size as the desired overlapping area, a processing error during a process of forming the storage electrode 120 and the recess 151 may yield an actual overlapping area different than the desired overlapping area. This may result from an alignment error between the storage electrode 120 and the recess 151 since the recess 151 may be formed by patterning the protection film 150 arranged on the storage electrode 120. Therefore, the storage electrode 120 may be formed larger than a desired overlapping area, or the recess 151 may be formed larger than the desired overlapping area as shown in FIG. 3A and FIG. 3B.

FIG. 3A and FIG. 3B are cross-sectional views of a region of the lower surface of the recess 151 and the storage electrode 120. Thus, the present exemplary embodiment will be described below with a width of the lower surface of the recess 151 and the storage electrode 120 as a reference.

Referring to FIG. 3A, the storage electrode 120 is arranged to have a width W1 larger than a width O of a desired overlapping area, and the recess 151 is arranged with the lower surface having a width W2 substantially identical with the width O of the desired overlapping area. Accordingly, a detrimental change in the overlapping area may not occur when a processing error occurs during the formation of the recess 151. For example, an alignment error of about 3 μm to about 4 μm may occur when the recess 151 is formed. The storage electrode 120 may have a width W1 that extends beyond the desired overlapping area width O by a distance corresponding to the alignment error. Therefore, a change in the overlapping area due to the alignment error can be prevented.

However, where the storage electrode 120 has a width W1 larger than a width O of a desired overlapping area, an aperture ratio of the pixel may be lowered. This may occur because an area of the storage electrode 120, which is a metal layer, is increased. Therefore, as shown in FIG. 3B, the storage electrode 120 may have a width W1 substantially identical to a width O of the desired overlapping area, and the concave recess 151 may be arranged with a lower surface having a width W2 that is larger than the width O of the desired overlapping area. Specifically, a width of the lower surface of the recess 151 may be about one-hundred one percent (101%) to about one-hundred fifty percent (150%) of a width of the storage electrode 120. Accordingly, a detrimental change in the overlapping area may not occur when a processing error occurs during the formation of the recess 151. Further, since the area of the storage electrode 120 is not enlarged, an aperture ratio of the pixel may be improved.

Hereinafter, a display panel according to an exemplary embodiment of the present invention will be described in further detail.

The gate lines 110 and storage electrode lines 121 may be arranged in a first direction on the lower substrate 100. The gate line 110 has a gate electrode 111 arranged to protrude from the gate line 110, and a gate pad (not shown) may be arranged at an end of the gate line 110. The storage electrode line 121 electrically connects adjacent storage electrodes 120. A storage electrode line 121 may be arranged in a quadrangular shape as shown in FIG. 1.

The gate line 110, the gate electrode 111, the storage electrode line 121, and the storage electrode 120 may be formed of a metal such as Aluminum (Al) or Chromium (Cr), but is not limited thereto. One or more of these components may be formed as a single layer or as multiple layers formed by consequently laminating Cr and Al.

The gate insulation film 131 is arranged on the gate line 110, the gate electrode 111, the storage electrode line 121, and the storage electrode 120. The gate insulation film 131 may be formed of a silicone oxide film and/or a silicone nitride film.

The data lines 140 are arranged on the gate insulation film 131 in a second direction that may be substantially orthogonal to the first direction. A data line 140 is formed integrally with a source electrode 134, which extends out from the data line 140. A drain electrode 135 is arranged in the pixel region adjacent to a source electrode 134. An active layer 132 used as a channel portion of the thin film transistor 130 is arranged below the source electrode 134 and the drain electrode 135. An ohmic contact layer 133 for reducing contact resistance is arranged between the active layer 132 and the source electrode 134 and the drain electrode 135. Further, the active layer 132 may be also arranged under the data line 140.

The protection film 150 is arranged on the data line 140, the source electrode 134, and the drain electrode 135. The protection film 150 may be made of an inorganic insulation material or an organic insulation material, such as resin. Further, a contact hole 152 is formed in the protection film 150 to expose the drain electrode 135. Similarly, the recess 151 is formed in the protection film 150 to expose an upper region of the storage electrode 120. As described above, the recess 151 is formed to have a size larger than a size of the storage electrode 120. Accordingly, the storage electrode 120 is positioned below the lower surface of the recess 151.

The pixel electrode 160 is arranged on the protection film 150. The pixel electrode 160 may be formed of indium tin oxide (ITO) or indium zinc oxide (IZO). Although not shown, the pixel electrode 160 may be partitioned into a plurality of domains and may include a cut-away or protrusion pattern. Further, a micro convexo-concave pattern for controlling the alignment of liquid crystal molecules may be formed in the domains of the pixel electrode 160.

A black matrix 210 is arranged on the upper substrate 200 in a region corresponding to the thin film transistor 130 on the lower substrate 100. Further, a color filter 220, which may be a red color filter 220, a green color filter 220, or a blue color filter 220, is arranged on the upper substrate 200 in a region corresponding to the pixel electrode 160 on the lower substrate 100. An overcoat film 230 is arranged on the upper substrate 200, and the common electrode 240 is arranged on the overcoat film 230. A protrusion pattern corresponding to a cut-away pattern of the pixel electrode 160 may be provided in the common electrode 240.

The display panel is manufactured by bonding the upper substrate 200 and the lower substrate 100 to be aligned, and then injecting a liquid crystal material therebetween. The liquid crystals in the liquid crystal material may be oriented perpendicular to the upper substrate 200 and the lower substrate 100 when no electric field is applied between the pixel electrode 160 and the common electrode 240.

Orientation films (not shown) may be formed on facing surfaces of the upper substrate 200 and the lower substrate 100. The orientation film may be a vertical orientation film for orienting liquid crystal molecules in a vertical direction with respect to the surface of the substrates. However, the orientation film is not limited to the vertical orientation film but may be an orientation film with a variety of shapes.

The display panel according to the present invention is not limited to the aforementioned exemplary embodiment and may be variously modified. For example, a pixel electrode 160 may be formed to be divided into a first pixel electrode and a second pixel electrode. If the pixel electrode is divided into a first pixel electrode and a second pixel electrode, a first peak voltage and a second peak voltage different than the first peak voltage may be applied to the first pixel electrode and the second pixel electrode, respectively, and a grayscale can be naturally expressed and a visual distortion of the displayed image, when viewed from side of the display panel, can be improved. To respectively apply different peak voltages to two pixel electrodes, two transistors may be arranged in a single pixel region. Further, different peak voltages may be applied to the two pixel electrodes through two data lines, respectively. Furthermore, one of the two pixel electrodes may be floated. Although the pixel region may have a length in the second direction that is larger than a length in the first direction, the present invention is not limited thereto. Rather, the pixel region may have a length in the first direction that is larger than a length in the second direction. Further, the pixel electrode may be arranged in a shape other than a rectangular shape. Moreover, the color filter 220 may be arranged on the lower substrate 100.

An LCD may be manufactured by arranging elements such a polarizing plate, a backlight, and a compensation plate on one or more sides of the display panel of this exemplary embodiment.

Figure 4A:
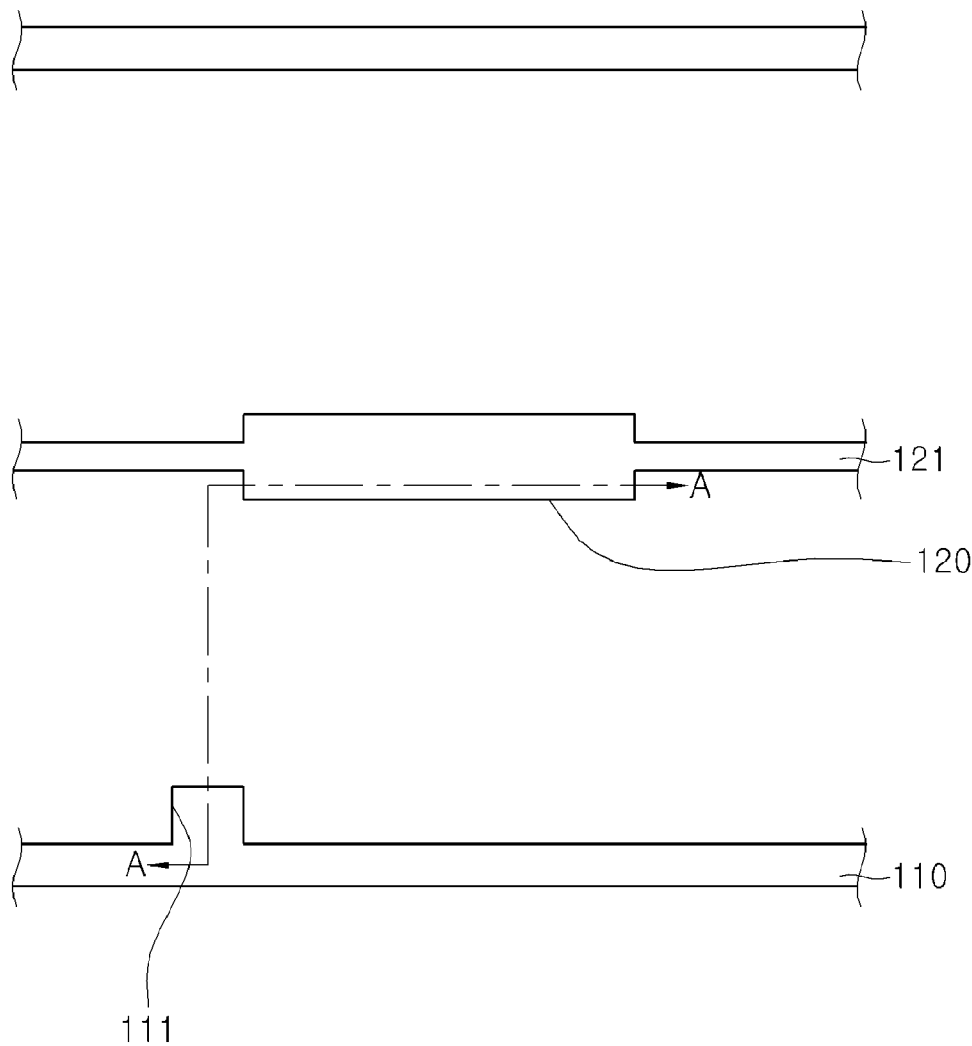
FIG. 4A is a plan view illustrating a step of a method for manufacturing the display panel according to an exemplary embodiment of the present invention.
Figure 4B:
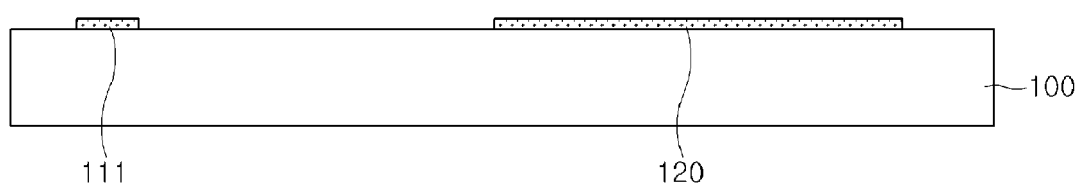
FIG. 4B is a cross-sectional view of the display panel shown in FIG. 4A, taken along line A-A.
Figure 5A:
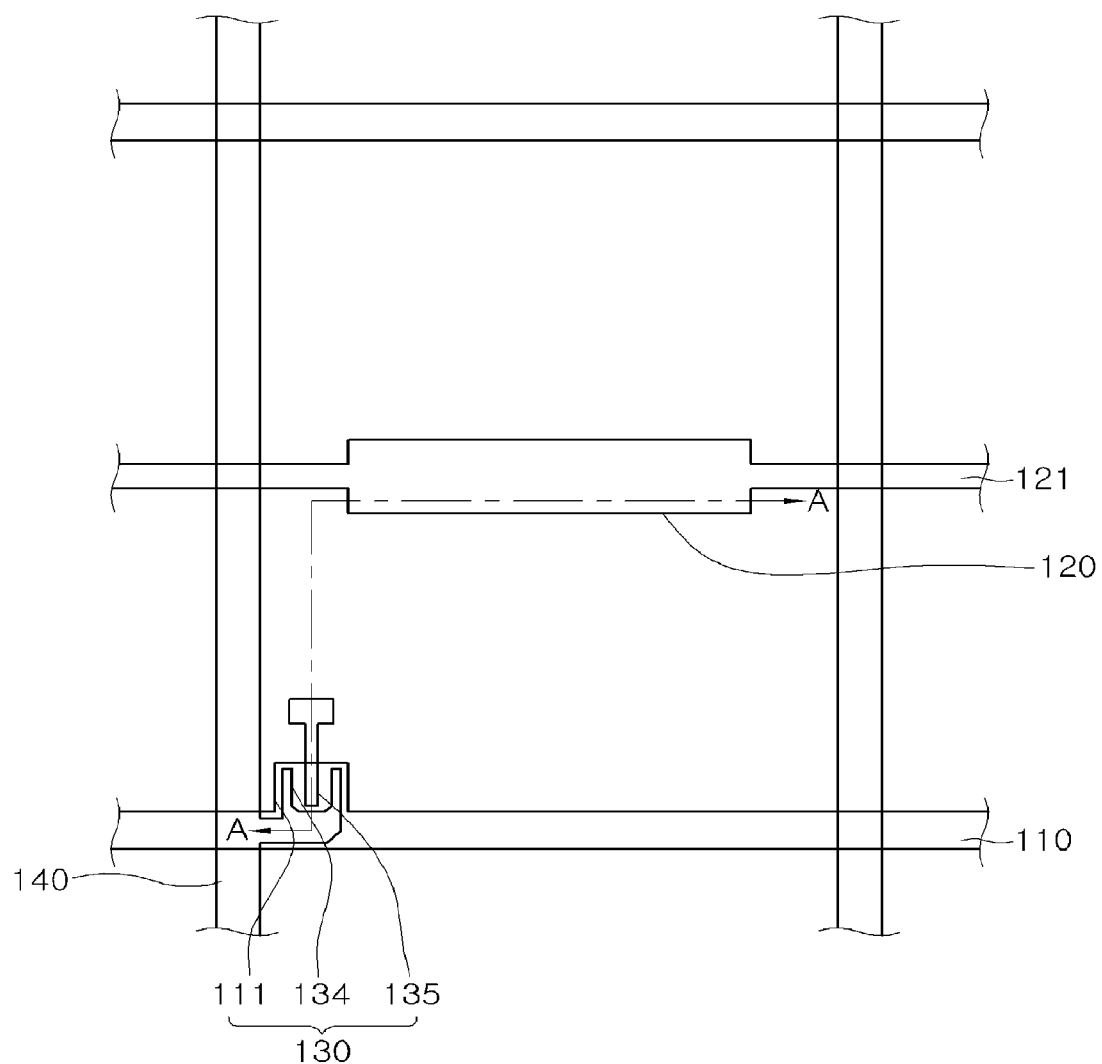
FIG. 5A is a plan view illustrating a method of manufacturing the display panel according to an exemplary embodiment of the present invention.
Figure 5B:
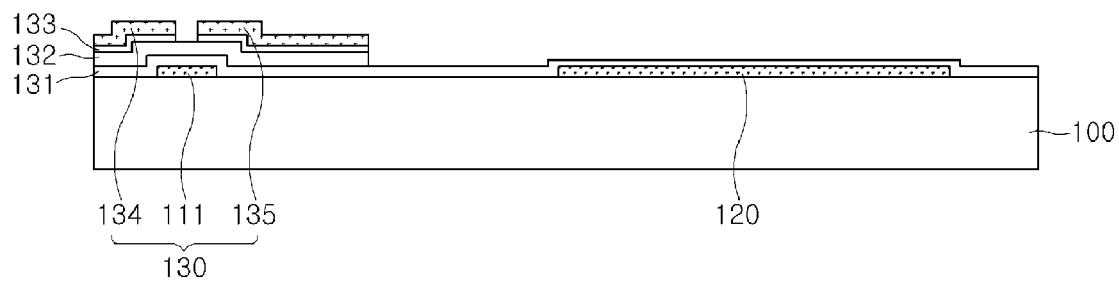
FIG. 5B is a cross-sectional view of the display panel shown in FIG. 5A, taken along line A-A.
Figure 6A:
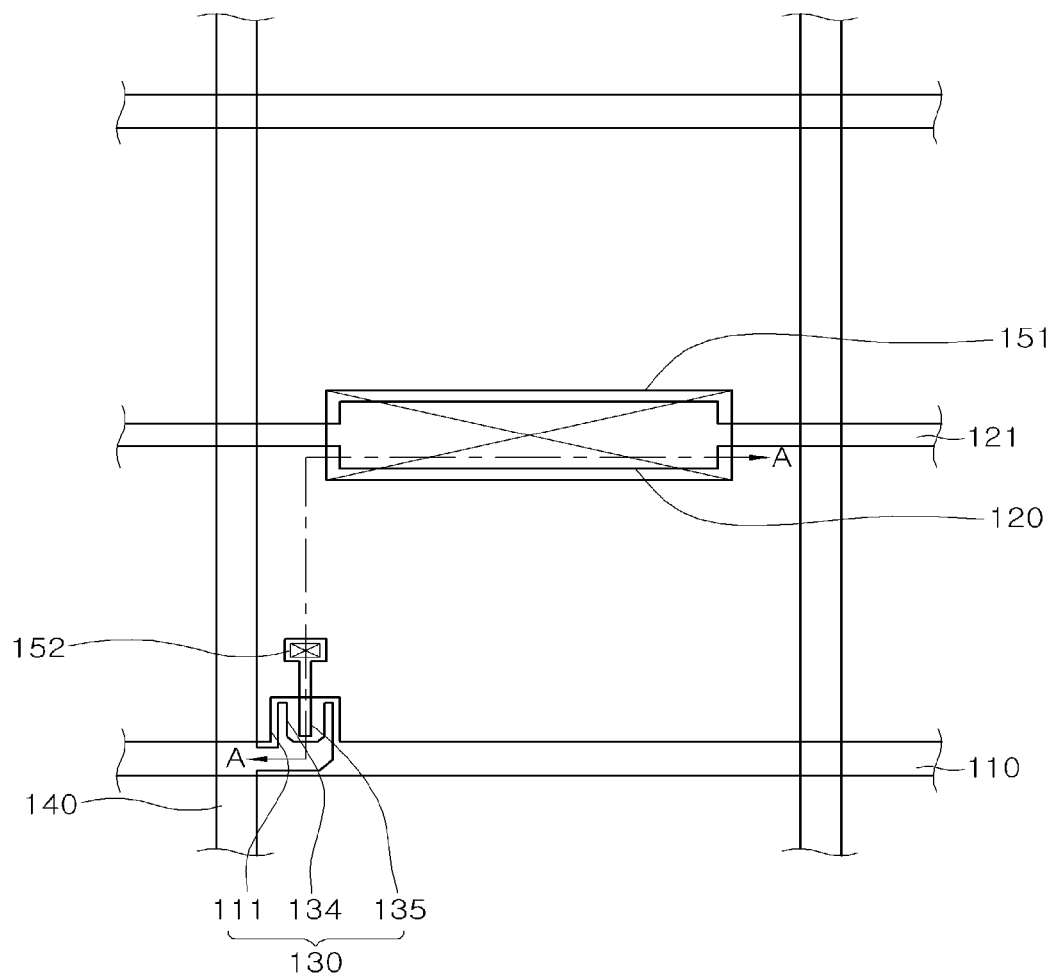
FIG. 6A is a plan view illustrating a step of a method for manufacturing the display panel according to an exemplary embodiment of the present invention.
Figure 6B:
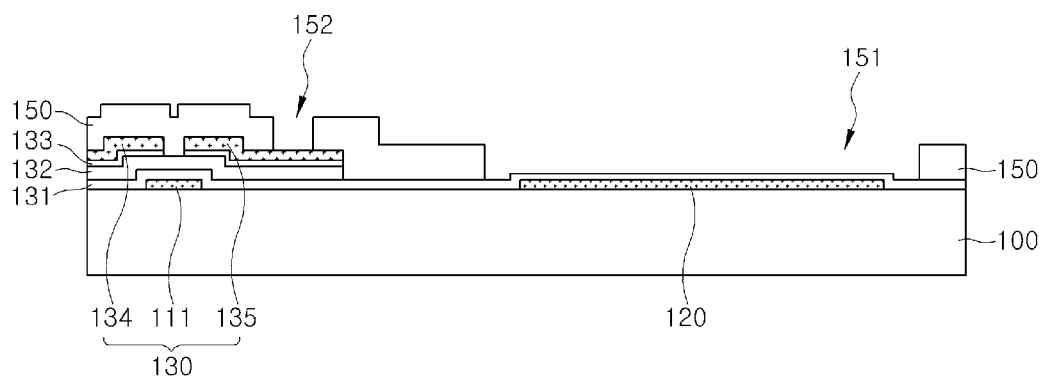
FIG. 6B is a cross-sectional view of the display panel shown in FIG. 6A, taken along line A-A.
Figure 7A:
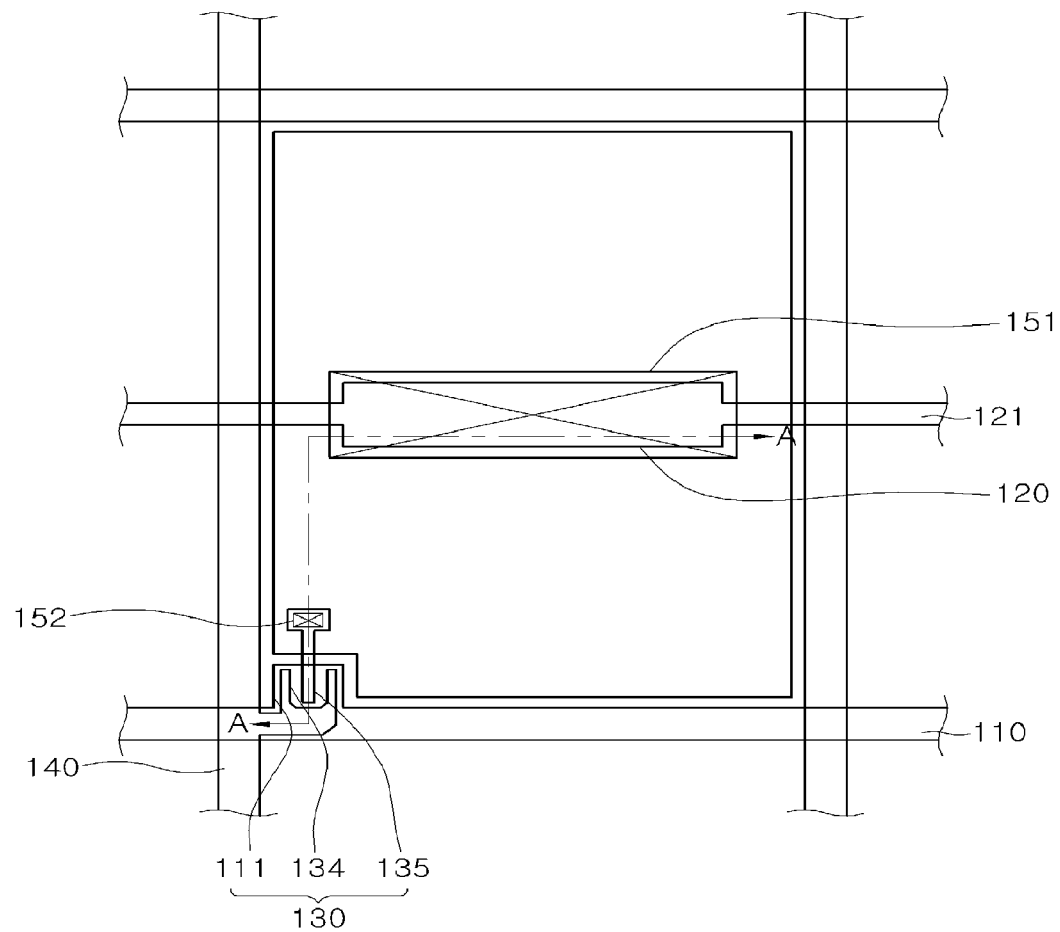
FIG. 7A is a plan view illustrating a step of a method for manufacturing the display panel according to an exemplary embodiment of the present invention.
Figure 7B:
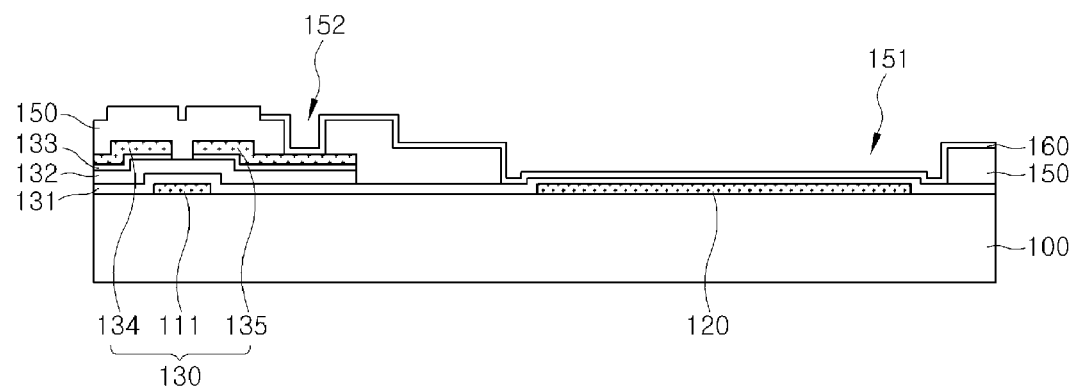
FIG. 7B is a cross-sectional view of the display panel shown in FIG. 7A, taken along line A-A.

FIG. 4A is a plan view illustrating a step of a method for manufacturing the display panel according to an exemplary embodiment of the present invention. FIG. 4B is a cross-sectional view taken along line A-A in FIG. 4A. FIG. 5A is a plan view illustrating a method of manufacturing the display panel according to an exemplary embodiment of the present invention. FIG. 5B is a cross-sectional view taken along line A-A in FIG. 5A. FIG. 6A is a plan view illustrating a step of a method for manufacturing the display panel according to an exemplary embodiment of the present invention. FIG. 6B is a cross-sectional view taken along line A-A in FIG. 6A. FIG. 7A is a plan view illustrating a step of a method for manufacturing the display panel according to an exemplary embodiment of the present invention. FIG. 7B is a cross-sectional view taken along line A-A in FIG. 7A.

Hereinafter, a method for manufacturing the display panel of this exemplary embodiment will be described with reference to FIG. 4A, FIG. 4B, FIG. 5A, FIG. 5B, FIG. 6A, FIG. 6B, FIG. 7A, and FIG. 7B.

Referring to FIG. 4A and FIG. 4B, a first metallic conductive film is formed on a lower substrate 100, which may be transparent. The first conductive film is patterned to form a gate electrode 111, a gate line 110, a storage electrode 120, and a storage electrode line 121.

The transparent lower substrate 100 may be a glass substrate. The first conductive film may be any one of Cr, MoW, Cr/Al, Cu, Al(Nd), Mo/Al, Mo/Al(Nd), Cr/Al(Nd) and Mo/Al/Mo, but the present invention is not limited thereto. Rather, the first conductive film may be any one metal of Al, Nd, Ag, Cr, Ti, Ta, Cu, and Mo, or an alloy or combination thereof, and may be formed as a single layer or as multiple layers as described above. The first conductive film may be formed through a deposition method using chemical vapor deposition (CVD), physical vapor deposition (PVD), or sputtering.

The first conductive film may be formed on the lower substrate 100 using one of the aforementioned methods and materials, and then a photoresist may be applied on the first conductive film. A first photoresist mask pattern may be formed by performing a photolithography process using a first mask. Here, the first mask may include light transmitting or shielding regions for forming the gate electrode 111, the gate line 110, the storage electrode 120, and the storage electrode line 121. The gate electrode 111, the gate line 110, the storage electrode 120, and the storage electrode line 121 may be formed by performing an etching process using the first photoresist mask pattern as an etching mask. Thereafter, the first photoresist mask pattern may be removed by performing a stripping process.

Referring to FIG. 5A and FIG. 5B, a gate insulation film 131, an active layer 132, an ohmic contact layer 133, and a second conductive film are sequentially formed on the lower substrate 100 having the storage electrode 120 formed thereon. The second conductive film may be patterned to form a source electrode 134, a drain electrode 135, and a data line 140.

The gate insulation film 131 may be formed through a deposition method such as plasma-enhanced chemical vapor deposition (PECVD), or sputtering. The gate insulation film 131 may be formed of an inorganic insulation material including a silicone oxide film or silicone nitride film. An amorphous silicone layer may be used as the active layer 132, and a silicide or amorphous silicone layer doped with highly concentrated impurities, such as N-type impurities, may be used as the ohmic contact layer 133. The second conductive film may be formed as a single layer or as multiple layers using at least one metal of Mo, Al, Cr, Ti, and Cu, or a combination or alloy thereof. The second conductive film may be formed of the same material as the first conductive film.

Thereafter, a photoresist may be applied on the second conductive film, and then a second photoresist mask pattern with a predetermined step may be formed through a photolithography process using a second mask. The second photoresist mask pattern may include the photoresist remaining on the source electrode 134, the drain electrode 135, and the data line 140. The photoresist on a channel region between the source electrode 134 and the drain electrode 135 may be formed to have a height that is smaller than the thickness of the photoresist formed on the source electrode 134 and the drain electrode 135. Therefore, a translucent mask or a rotating exposure mask may be used as the second mask.

The second conductive film, the ohmic contact layer 133 and the active layer 132 are then removed by performing an etching process using the second photoresist mask as an etching mask. More specifically, the second conductive film in the region exposed by the second photoresist mask pattern may be removed through a wet etching process, and the ohmic contact layer 133 and the active layer 133 may be removed through a dry etching process. Next, the entire height of the second photoresist mask pattern may be lowered by performing an ashing process. Accordingly, the second photoresist mask pattern may be formed so that the step region corresponding to the channel region is exposed. The ohmic contact layer 133 and the second conductive film in the channel region may be removed by performing the etching process again. Thereafter, the residue of the second photoresist mask pattern may be removed by performing a stripping process. Accordingly, the data line 140, the source electrode 134, and the drain electrode 135 are formed, and the channel region of the active layer 132 is formed between the source electrode 134 and the drain electrode 135.

Referring to FIG. 6A and FIG. 6B, a protection film 150 is formed on the lower substrate 100 having the thin film transistor 130 and the data line 140 formed thereon. A portion of the protection film 150 is removed to form a contact hole 152 to expose a portion of the rain electrode 135 of the thin film transistor 130. A portion of the protection film 150 is removed to form a recess 151 to expose a region corresponding to an upper surface of the storage electrode 120.

The protection film 150 may be formed on the lower substrate 100 shown in FIG. 5B using one of the aforementioned thin film deposition methods. The protection film 150 may be formed using a coating method. The protection film 150 may be made of an organic material or an inorganic material. In this exemplary embodiment, the protection film may be made of a photosensitive organic material. Further, a portion of the protection film 150 may be removed by performing a photo-etching process using a third mask to form the contact hole 152 and the recess 151. The third mask may be provided with light transmitting regions for forming the contact hole 152 and the recess 151. The light transmitting region in the third mask for forming the recess 151 may be formed to be larger than a region for forming the storage electrode 120 in the first mask. This is because an error of about 2 μm to about 5 μm may occur according to an alignment error during a photo-etching process or according to a wavelength of light. If the light transmitting region for forming the recess 151 is formed to have a size larger than a region for forming the storage electrode 120 by the above alignment error, a phenomenon where the overlapping region between the storage electrode 120 and a pixel electrode 160 is reduced can be prevented. Further, the aperture ratio of a pixel can be enhanced by reducing the size of the storage electrode 120 to be smaller than that of the recess 151. In addition, the protection film 150 between the pixel electrode 160 and the storage electrode 120 may be removed to reduce a distance between the pixel electrode 160 and the storage electrode 120, and the capacitance of the storage capacitor can be increased.

Where the protection film 150 is formed of an inorganic material, after a photoresist is applied on the protection film 150, a third photoresist mask pattern may be formed by performing a photo-etching process using the third mask. Then, the contact hole 152 and the recess 151 may be formed by partially removing the protection film 150 using the third photoresist mask pattern.

Referring to FIG. 7A and FIG. 7B, a third conductive film is formed on the patterned protection film 150. A transparent conductive film formed of, for example, indium tin oxide (ITO) or indium zinc oxide (IZO), may be used as the third conductive film. A photoresist is applied on the third conductive film, and a fourth photoresist mask pattern is then formed by performing a photo-etching process using a fourth mask. A portion of the third conductive film is removed through an etching process using the fourth photoresist mask pattern as an etching mask to form the pixel electrode 160. The pixel electrode 160 is also formed in an interior region of the recess 151 of the protection film 150.

As described above, the upper substrate 200 having a black matrix 210, a color filter 220, an overcoat film 230, and a common electrode 240 arranged thereon is aligned with the lower substrate 100 having the thin film transistor 130, the storage electrode 120, and the pixel electrode 160 formed thereon. Thereafter, the display panel is manufactured by sealing the upper substrate 200 and the lower substrate 100, and forming a liquid crystal layer therebetween.

The present invention is not limited the aforementioned descriptions. For example, a multi-layered film may be used as a film for protecting the thin film transistor. That is, a passivation film and the protection film may be formed together on the thin film transistor. Further, the passivation film and the gate insulation film may be used as a dielectric film between the storage electrode 120 and the pixel electrode 160 by patterning only the protection film 150 in a region corresponding to an upper surface of the storage electrode 120.

Hereinafter, a method of manufacturing a display panel according to another exemplary embodiment of the present invention will be described with reference to the following drawings. Descriptions previously provided above will be omitted, and the description provided below will focus on differences between the exemplary embodiments previously described and the present exemplary embodiment.

FIG. 8, FIG. 9, FIG. 10, FIG. 11, and FIG. 12 are cross-sectional views, taken along line A-A in FIG. 1, illustrating a method for manufacturing a display panel according to an exemplary embodiment of the present invention.

Figure 8:
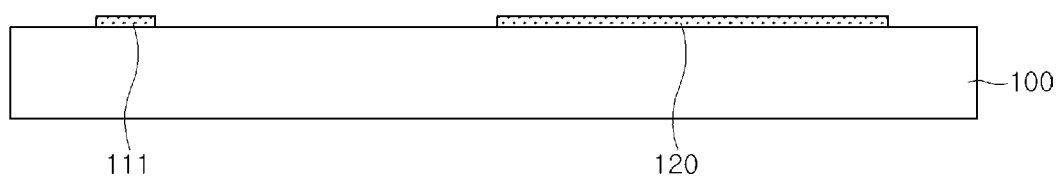

Referring to FIG. 8, a first metallic conductive film is formed on a transparent lower substrate 100. The first conductive film is patterned to form a gate electrode 111 and a storage electrode 120. A storage electrode line 121 connecting adjacent storage electrodes 120 may be formed together with a gate line 110 connected to the gate electrode 111.

Figure 9:
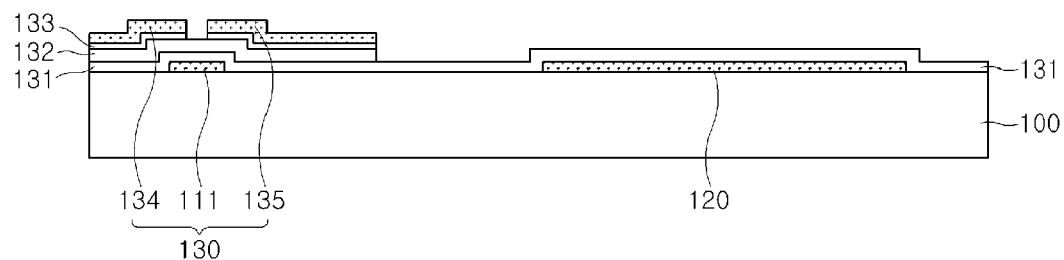

Referring to FIG. 9, a gate insulation film 131, an active layer 132, an ohmic contact layer 133, and a second conductive film are sequentially formed on the lower substrate 100 having the gate electrode 111 and the storage electrode 120 formed thereon. The second conductive film, the ohmic contact layer 133 and the active layer 132 are patterned to form a source electrode 134, and a drain electrode 135. Accordingly, a thin film transistor 130 comprising the gate electrode 111, the source electrode 134, and the drain electrode 135 is formed. A data line 140 is formed together with and connected to the source electrode 134.

Figure 10:
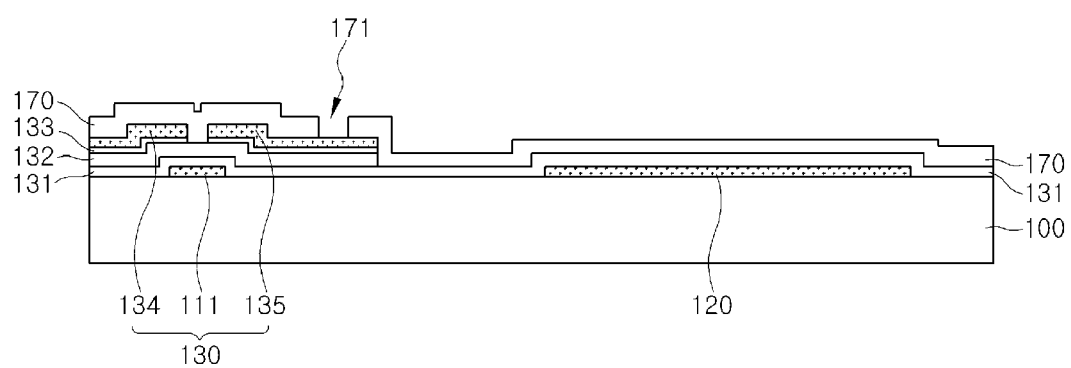

Referring to FIG. 10, a passivation film 170 is formed on the lower substrate 100 having the thin film transistor 130 formed thereon. A portion of the passivation film 170 is removed to form a lower contact hole 171 exposing a portion of the drain electrode 135 of the thin film transistor 130.

The passivation film 170 may be formed of a single layer or multiple layers, including a SiOx film, a SiONx film, or a SiNx film of an inorganic insulation material. In this exemplary embodiment, the passivation film 170 is formed on the entire surface of the lower substrate 100. Thereafter, a photoresist is applied on the passivation film 170, and then a photoresist mask pattern (not shown) may be formed by performing an exposing and developing process using a mask. A portion of the passivation film 170 in an upper region of the drain electrode 135 may be removed by performing an etching process using the photoresist mask pattern as an etching mask. Therefore, a lower contact hole 171 may be formed to expose a portion of the drain electrode 135. Then, the photoresist mask pattern may be removed. Accordingly, the gate insulation film 131 and the passivation film 170 may remain on the storage electrode 120.

Figure 11:
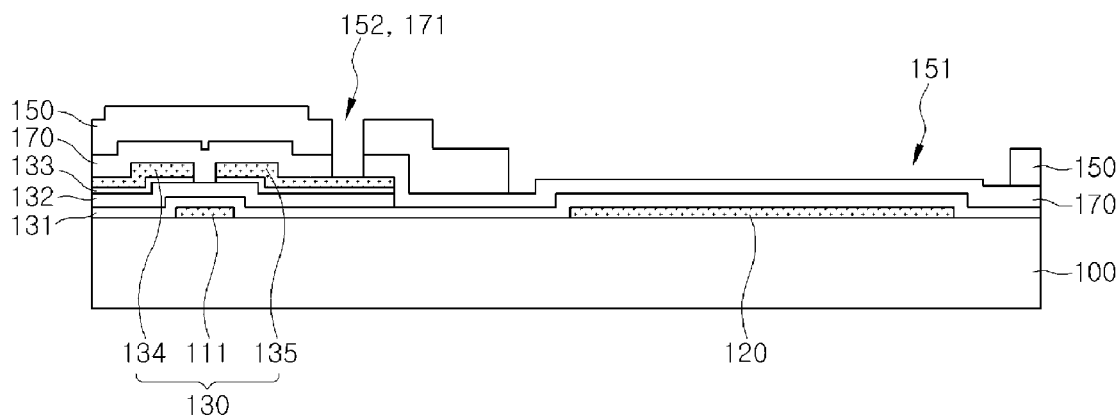

Referring to FIG. 11, a protection film 150 may be formed on the passivation film 170. The protection film 150 may be partially removed to form an upper contact hole 152 to expose the lower contact hole 171. Additionally, the protection film 150 may be partially removed to form a recess 151 to expose a region corresponding to an upper surface of the storage electrode 120.

The recess 151 may be formed to have a size larger than that of the storage electrode 120. More specifically, the recess 151 may be formed to have a size large than that of the storage electrode 120 by a distance corresponding to an alignment error during a photo-etching process or an error according to a wavelength of light.

Accordingly, as described above, a phenomenon where the overlapping region between the storage electrode 120 and a pixel electrode 160 is reduced can be prevented. Further, the aperture ratio of a pixel can be enhanced by reducing the size of the storage electrode 120 to be smaller than that of the recess 151. In addition, the gate insulation film 131 and the passivation film 170 may be positioned as a dielectric film in a region between the storage electrode 120 and the pixel electrode 160 in this exemplary embodiment. Thus, a distance between the storage electrode 120 and the pixel electrode 160 may be controlled by adjusting the thickness of the passivation film 170, so that a desired capacitance of the storage capacitor, including the storage electrode 120 and the pixel electrode 160, can be achieved.

Figure 12:
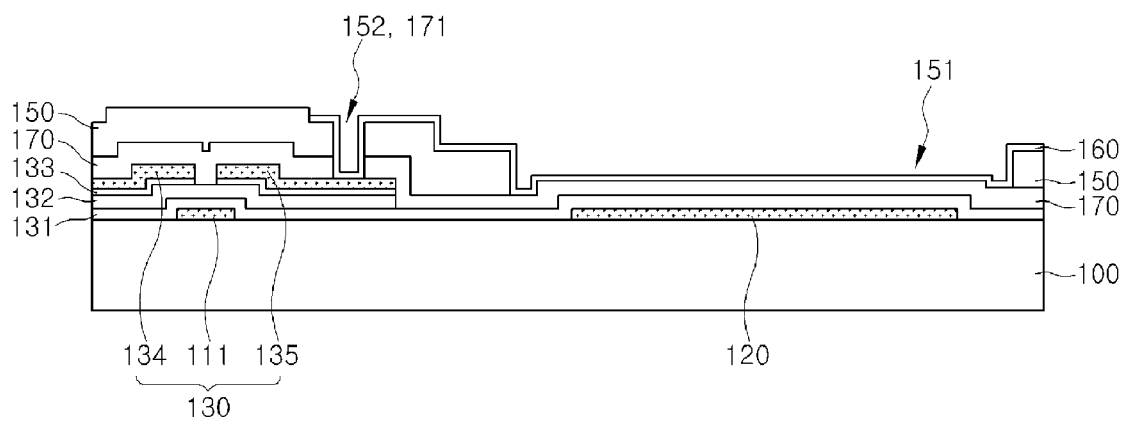

Referring to FIG. 12, a third conductive film may be formed on the patterned protection film 150. The third conductive film may be a transparent conductive film such as ITO or IZO. The third conductive film may be patterned to form the pixel electrode 160. The pixel electrode 160 may be formed in an interior region of the recess 151 of the protection film 150.

As described above, the upper substrate 200 having a black matrix 210, a color filter 220, an overcoat film 230, and a common electrode 240 arranged thereon is aligned with the lower substrate 100 having the thin film transistor 130, the storage electrode 120, and the pixel electrode 160 formed thereon. Thereafter, the display panel is manufactured by sealing the upper substrate 200 and the lower substrate 100, and forming a liquid crystal layer therebetween.

As described above, according to the present invention, a capacitance between a storage electrode and a pixel electrode can be increased through a recess exposing a region corresponding to an upper surface of the storage electrode.

In addition, the recess may be formed to have a size larger than a size of the storage electrode, so that a processing margin can be secured and the aperture ratio of a pixel can be enhanced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor substrate, comprising:
   a thin film transistor arranged on a substrate, wherein the thin film transistor comprises a gate electrode, a first insulation film arranged on the gate electrode, an active layer arranged on the first insulation film, a source electrode and a drain electrode arranged on the active layer;
   a storage electrode arranged on the substrate;
   a second insulation film arranged on the thin film transistor;
   a recess formed in the second insulation film; and
   a pixel electrode arranged on the second insulation film and the recess, wherein the pixel electrode is connected to the thin film transistor,
   wherein a width of the recess is larger than a width of the storage electrode.

2. The thin film transistor substrate of claim 1, wherein the storage electrode comprises the same material as the gate electrode.

3. The thin film transistor substrate of claim 1, wherein a width of the recess is about one-hundred one percent (101%) to about one-hundred fifty percent (150%) of a width of the storage electrode.

4. The thin film transistor substrate of claim 1, further comprising a passivation film between the first insulation film and the second insulation film.

5. The thin film transistor substrate of claim 4, wherein the recess exposes the passivation film.

6. The thin film transistor substrate of claim 1, wherein the recess exposes the first insulation film.

7. A display panel, comprising:
   a first substrate comprising:
      a thin film transistor arranged on the first substrate, wherein the thin film transistor comprises a gate electrode, a first insulation film arranged on the gate electrode, an active layer arranged on the first insulation film, a source electrode and a drain electrode arranged on the active layer; a storage electrode arranged on the substrate;
      a second insulation film arranged on the thin film transistor;
      a recess formed in the second insulation film; and
      a pixel electrode arranged on the second insulation film and the recess, wherein the pixel electrode is connected to the thin film transistor,
   a second substrate comprising a common electrode arranged corresponding to the pixel electrode; and
   a liquid crystal layer arranged between the first substrate and the second substrate,
   wherein a width of the recess is large than a width of the storage electrode.

8. The display panel of claim 7, wherein the storage electrode comprises the same material as the gate electrode.

9. The display panel of claim 7, wherein a width of the recess is about one-hundred one percent (101%) to about one-hundred fifty percent (150%) of a width of the storage electrode.

10. The display panel of claim 7, wherein vertical orientation films are provided on the pixel electrode and the common electrode.

11. The display panel of claim 7, wherein a passivation film is arranged between the first insulation film and the second insulation film.

12. The display panel of claim 11, wherein the recess exposes the passivation film.

13. The display panel of claim 7, wherein the recess exposes the first insulation film.

14. A method for manufacturing a thin film transistor substrate, comprising:
    forming a gate electrode and a storage electrode on a substrate;
    forming a gate insulation film on the gate electrode and the storage electrode;
    forming an active layer on the gate insulation;
    forming a source electrode and a drain electrode on the active layer;
    forming a protection film on the substrate;
    forming a recess; and
    forming a pixel electrode on the recess and on the protection film,
    wherein forming a recess comprises removing a portion of the protection film having a size larger than a size of the storage electrode in a region corresponding to the storage electrode.

15. The method of claim 14, wherein forming the storage electrode further comprises:
    forming a conductive film on the transparent substrate;
    forming a first photoresist mask pattern through a photo-etching process using a first mask having a light transmitting or light shielding region corresponding to a storage electrode region; and
    removing a portion of the conductive film using the first photoresist mask pattern to form the storage electrode.

16. The method of claim 14, wherein forming the recess further comprises:
    forming a photoresist on the protection film;
    forming a second photoresist mask pattern through a photo-etching process using a second mask having a light transmitting or light shielding region with a size larger than the light transmitting or light shielding region of the first mask; and
    removing a portion of the protection film using the second photoresist mask pattern.

17. The thin film transistor substrate of claim 1, wherein the storage electrode is arranged below a lower surface of the recess.

18. The thin film transistor substrate of claim 1, wherein the recess is larger than an overlapping area between the storage electrode and the pixel electrode.

19. The thin film transistor substrate of claim 18, wherein the recess is completely covering an overlapping area between the storage electrode and the pixel electrode.

20. The thin film transistor substrate of claim 1, wherein a distance between the pixel electrode and the storage electrode is smaller than a distance between the pixel electrode and the gate electrode.

21. The thin film transistor substrate of claim 1, further comprising a storage electrode line arranged on the substrate, wherein the storage electrode line electrically connects adjacent storage electrodes.

22. The thin film transistor substrate of claim 21, wherein the storage electrode line is partially overlapped with the recess.

* * * * *